(12) United States Patent
Ishiwata et al.

(10) Patent No.: US 8,847,264 B2
(45) Date of Patent: Sep. 30, 2014

(54) LUMINAIRE

(71) Applicant: Toshiba Lighting & Technology Corporation, Yokosuka (JP)

(72) Inventors: Tomoko Ishiwata, Yokosuka (JP); Miho Watanabe, Yokosuka (JP); Kiyoshi Nishimura, Yokosuka (JP)

(73) Assignee: Toshiba Lighting & Technology Corporation, Yokosuka-shi, Kanagawa-ken (JP)

( * ) Notice: Subject to any disclaimer, the term of this patent is extended or adjusted under 35 U.S.C. 154(b) by 0 days.

(21) Appl. No.: 13/832,508

(22) Filed: Mar. 15, 2013

(65) Prior Publication Data

US 2013/0249389 A1 Sep. 26, 2013

(30) Foreign Application Priority Data

Mar. 23, 2012 (JP) ................. 2012-068467

(51) Int. Cl.
| | |
|---|---|
| *F21K 99/00* | (2010.01) |
| *H01L 25/075* | (2006.01) |
| *H05B 33/12* | (2006.01) |
| *F21V 23/02* | (2006.01) |
| *F21Y 105/00* | (2006.01) |
| *F21V 3/00* | (2006.01) |
| *F21Y 101/02* | (2006.01) |
| *H01L 33/50* | (2010.01) |
| *F21V 23/00* | (2006.01) |

(52) U.S. Cl.
CPC ............... *H05B 33/12* (2013.01); *F21V 23/02* (2013.01); *F21Y 2105/001* (2013.01); *F21V 3/00* (2013.01); *F21Y 2101/02* (2013.01); *F21K 9/1355* (2013.01); *H01L 33/502* (2013.01); *H01L 25/0753* (2013.01); *F21V 23/006* (2013.01)
USPC .............................. 257/98; 313/110

(58) Field of Classification Search
USPC ............................. 313/110; 257/98
See application file for complete search history.

(56) References Cited

U.S. PATENT DOCUMENTS

| | | | |
|---|---|---|---|
| 7,497,973 B2 | 3/2009 | Radkov et al. | |
| 2006/0169998 A1 | 8/2006 | Radkov et al. | |
| 2006/0255710 A1* | 11/2006 | Mueller-Mach et al. | ..... 313/485 |

FOREIGN PATENT DOCUMENTS

| | | |
|---|---|---|
| JP | 2009-528429 A | 8/2009 |
| WO | 2007/100824 A2 | 9/2007 |

* cited by examiner

*Primary Examiner* — Mary Ellen Bowman
(74) *Attorney, Agent, or Firm* — Banner & Witcoff, Ltd.

(57) ABSTRACT

A luminaire includes a semiconductor light source having a light emission peak in a range of wavelength smaller than 480 nm and a phosphor excited by light radiated from the semiconductor light source to radiate light having wavelength equal to or larger than 480 nm. A spectrum of radiated light obtained by combining the light radiated from the semiconductor light source and the light radiated from the phosphor has a light emission peak in a range of wavelength equal to or larger than 610 nm and smaller than 650 nm. A ratio of radiation energy in a range of wavelength equal to or larger than 650 nm and equal to or smaller than 780 nm to radiation energy in a range of wavelength equal to or larger than 600 nm and smaller than 650 nm is equal to or lower than 35%. A color gamut area ratio exceeds 100%.

14 Claims, 9 Drawing Sheets

US 8,847,264 B2

LUMINAIRE

CROSS-REFERENCE TO RELATED APPLICATIONS

This application is based upon and claims the benefit of priority from Japanese Patent Application No. 2012-068467, filed on Mar. 23, 2012; the entire contents of which are incorporated herein by reference.

FIELD

Embodiments described herein relate generally to a luminaire.

BACKGROUND

Luminaires including semiconductor light sources represented by a blue light emitting diode (LED) are spreading. Above all, a white light source that radiates combined light of blue light of the blue LED and light radiated from a phosphor excited by the blue light can be used for a wide range of uses because the white light source can be easily reduced in size and a circuit configuration can be simplified. For example, there is a white light source obtained by combining the blue LED and a YAG phosphor (yttrium aluminum garnet phosphor) excited by the blue light to radiate yellow light. Further, there is a white light source of a high color rendering type added with a red phosphor such as a CASN phosphor in order to improve color rendering properties.

However, the red phosphor represented by the CASN phosphor has a wide radiation spectrum. The radiation spectrum extends to a range exceeding light wavelength of 600 nanometers (nm). On the other hand, the human visibility has a peak near light wavelength of 555 nm and decreases as wavelength is larger. Therefore, if the red phosphor is added in order to improve the color rendering properties, light in a red region with low visibility increases and light emission efficiency falls.

DETAILED DESCRIPTION

Figure 1A:
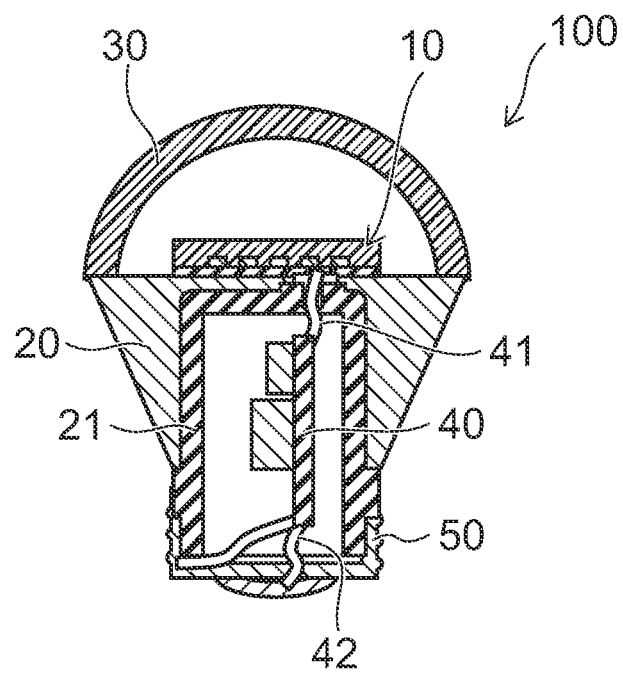
FIGS. 1A and 1B are schematic sectional views showing a luminaire according to a first embodiment.

In general, according to one embodiment, a luminaire includes: a semiconductor light source having a light emission peak in a range of wavelength smaller than 480 nm; and a phosphor excited by light radiated from the semiconductor light source to radiate light having wavelength equal to or larger than 480 nm. A spectrum of radiated light obtained by combining the light radiated from the semiconductor light source and the light radiated from the phosphor has a light emission peak in a range of wavelength equal to or larger than 610 nm and smaller than 650 nm. A ratio of radiation energy in a range of wavelength equal to or larger than 650 nm and equal to or smaller than 780 nm to radiation energy in a range of wavelength equal to or larger than 600 nm and smaller than 650 nm is equal to or lower than 35%. A color gamut area ratio exceeds 100%.

Embodiments are explained below with reference to the drawings. The same components in the drawings are denoted by the same reference numerals and signs and detailed explanation of the components is omitted as appropriate. Different components are explained.

First Embodiment

FIG. 1A is a schematic sectional view showing a luminaire 100 according to a first embodiment. As shown in the figure, the luminaire 100 is, for example, a bulb-type lamp. The luminaire 100 includes a light-emitting section 10, a housing 20, and a cover 30 configured to cover the light-emitting section 10.

A power converting section 40 configured to supply electric power to the light-emitting section 10 is provided on the inside of the housing 20. The power converting section 40 is electrically connected to the light-emitting section 10 and a cap 50 via lead wires 41 and 42. The power converting section 40 is housed in an insulated case 21 provided on the inside of the housing 20. The power converting section 40 receives the supply of alternating-current power from a not-shown commercial power supply via the cap 50, converts the alternating-current power into, for example, direct-current power, and supplies the direct-current power to the light-emitting section 10.

Figure 1B:
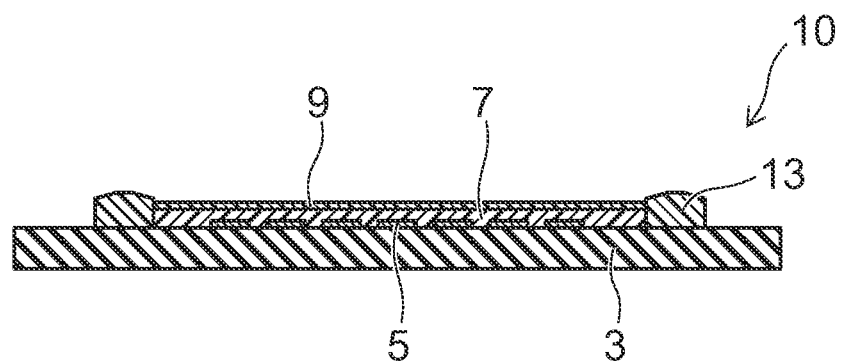

As shown in FIG. 1B, the light-emitting section 10 includes a substrate 3, a plurality of semiconductor light sources 5 mounted on the substrate 3, first transparent resin 7 that seals the semiconductor light sources 5, and second transparent resin 9.

The substrate 3 is, for example, an insulative resin base. The substrate 3 includes metal wiring (not shown in the figure) on the upper surface thereof. The semiconductor light sources 5 radiate light having an intensity peak at light wavelength of 480 nm. For example, a blue LED or ultraviolet LED chip made of a GaN nitride semiconductor and formed on a sapphire substrate can be used as the semiconductor light source 5. The plurality of semiconductor light sources 5 are mounted on the substrate 3 using a transparent adhesive and connected in series or in parallel via a metal wire (not shown in the figure). The semiconductor light sources 5 receive the supply of direct-current power from the power converting section 40 via the metal wire connected to the metal wiring and radiates light having an intensity peak in a range of wavelength smaller than 480 nm.

A bank 13 made of white resin surrounding a portion where the semiconductor light sources 5 are mounted is provided. The first transparent resin 7 that transmits the light irradiated by the semiconductor light sources 5 is poured into the inner side of the bank 13 and hardened to seal the semiconductor light sources 5. The first transparent resin 7 includes, for example, a member that scatters the radiated light of the semiconductor light sources 5. Further, the second transparent resin 9 including a phosphor is provided on the first transparent resin 7. The phosphor is excited by the light radiated from the semiconductor light sources 5 to radiate light having wavelength equal to or larger than 480 nm.

The second transparent resin 9 includes at least one of a yellow phosphor and a green phosphor and a red phosphor. The red phosphor has a light emission peak in a range of wavelength equal to or larger than 610 nm and smaller than 650 nm. Half width of the light emission peak of the red phosphor is smaller than half width of a light emission peak of a CASN phosphor and is, for example, equal to or smaller than 20 nm.

The first transparent resin 7 and the second transparent resin 9 desirably include the same main component, for example, silicone. A scattering material included in the first transparent resin 7 is, for example, at least one selected out of a translucent inorganic substance, a carbide, and glass. The translucent inorganic substance is, for example, silica ($SiO_2$). As the red phosphor, a fluoride phosphor such as $K_2SiF_6$:Mn can be used. The yellow phosphor is, for example, a YAG phosphor. The green phosphor is, for example, the YAG phosphor, a silicate phosphor, or a nitride phosphor.

In this embodiment, the semiconductor light sources 5 are sealed by, for example, the first transparent resin 7 including silica by 20% or more and the second transparent resin 9 including the phosphor is provided on the first transparent resin 7, whereby the influence of heat generation of the semiconductor light sources 5 on the phosphor is reduced. For example, light emission intensity of the phosphor falls as temperature rises. In the red phosphor, since a ratio of stokes loss and non-light emission recombination is large, a change in light emission intensity due to temperature is larger than that of the YAG phosphor. Therefore, correlated color temperature of a luminaire including both of the YAG phosphor and the red phosphor tends to rise as temperature rises. In this embodiment, since the second transparent resin 9 including the phosphor is provided on the first transparent resin 7 that seals the semiconductor light sources 5, it is possible to suppress a temperature rise of the phosphor and suppress a change in the correlated color temperature.

The red phosphor, the yellow phosphor, and the green phosphor may be respectively contained in different transparent resins. For example, the yellow phosphor and the green phosphor are contained in the first transparent resin 7 and the red phosphor is contained in the second transparent resin 9. Consequently, it is possible to suppress a temperature rise of the red phosphor and suppress a rise in the correlated color temperature. That is, it is desirable to arrange a phosphor having a small change in light emission intensity due to temperature on a side close to the semiconductor light sources 5.

Characteristics of the luminaire 100 according to the first embodiment are explained with reference to FIGS. 2A and 2B to FIGS. 4A and 4B. The second transparent resin 9 in this embodiment includes a red phosphor (a first phosphor) having a light emission peak in a range of wavelength equal to or larger than 610 nm and smaller than 650 nm, a yellow phosphor (a second phosphor) having a light emission peak in a range of wavelength equal to or larger than 540 nm and equal to or smaller than 580 nm, and a green phosphor (a third phosphor) having a light emission peak in a range of wavelength equal to or larger than 480 nm and smaller than 540 nm.

Figure 2A:
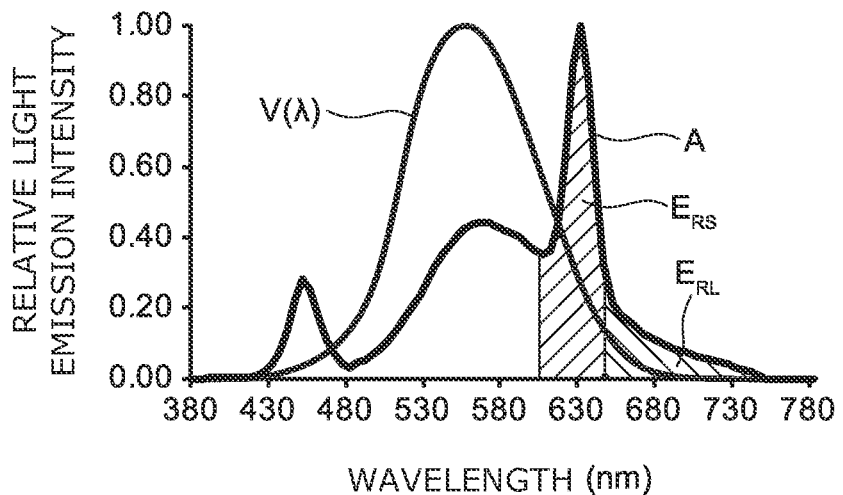
FIGS. 2A and 2B show radiation spectra of the luminaire according to the first embodiment.
Figure 2B:
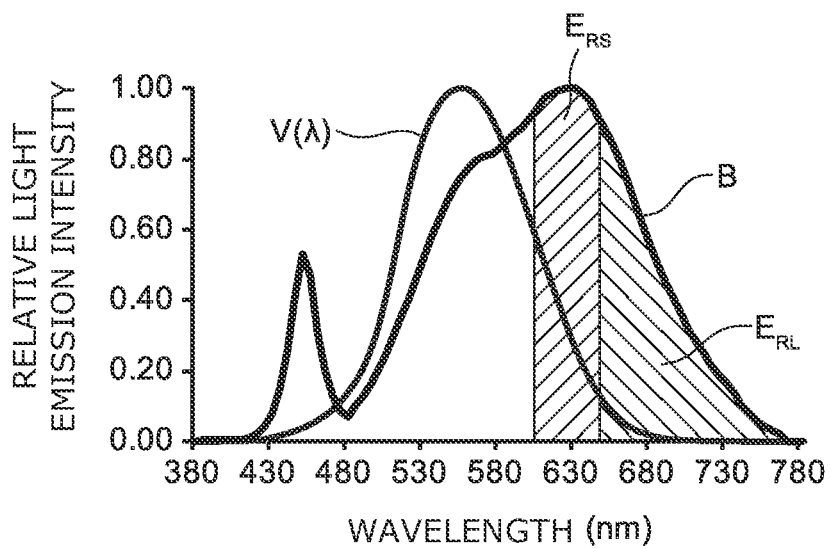
Figure 3A:
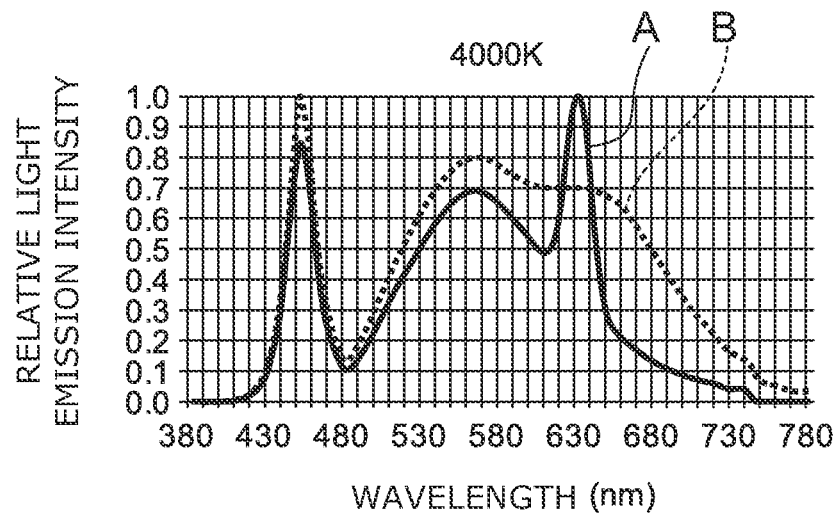
FIGS. 3A and 3B show radiation spectra of the luminaire according to the first embodiment.
Figure 3B:
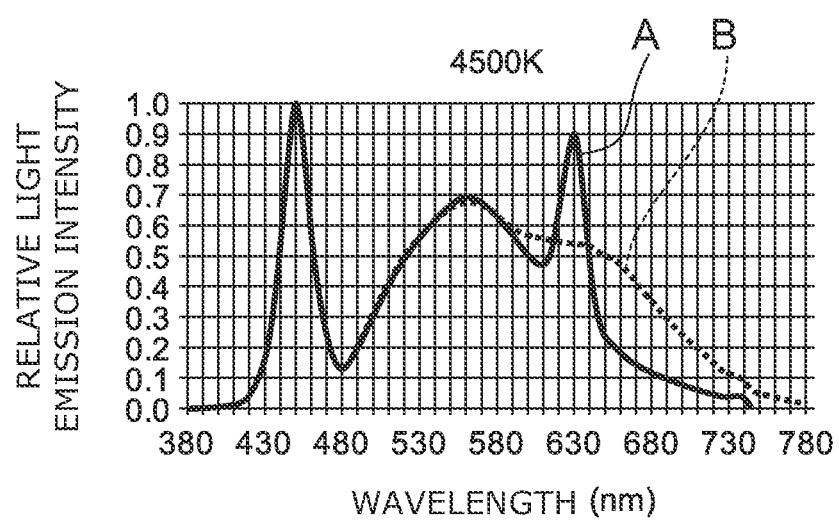
Figure 4A:
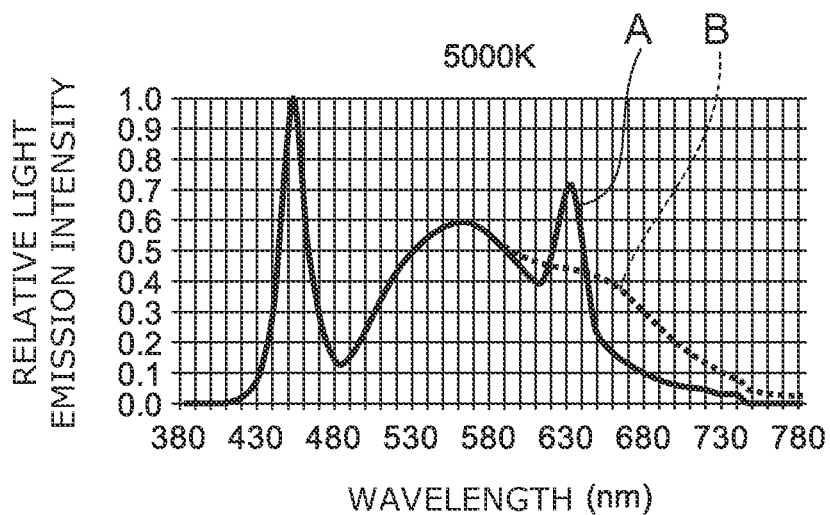
FIGS. 4A and 4B show radiation spectra of the luminaire according to the first embodiment.
Figure 4B:
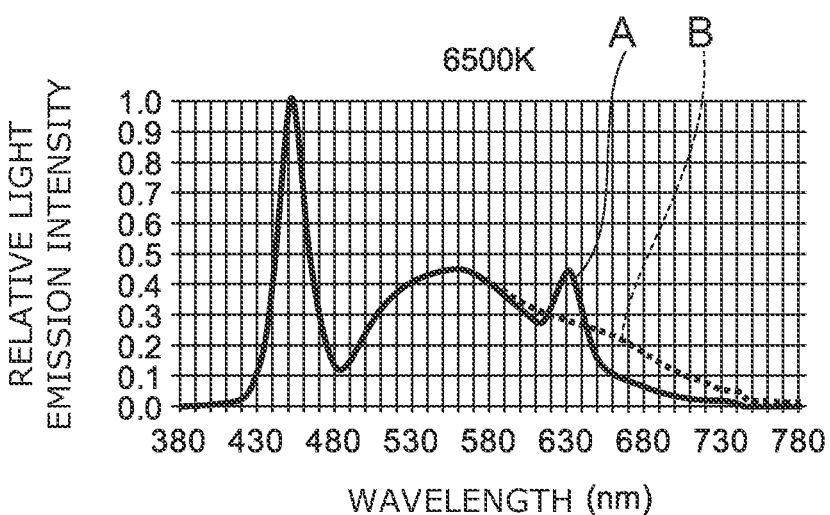

FIG. 2A represents a radiation spectrum of the luminaire 100. FIG. 2B represents a radiation spectrum of a luminaire according to a comparative example. An example in which correlated color temperature is 2800 kelvin (K) and an average color rendering index Ra is 83 is shown in both FIGS. 2A and 2B. Standardized visibility $V(\lambda)$ is shown in both FIGS. 2A and 2B. The abscissa indicates light wavelength and the ordinate indicates relative light emission intensity obtained by standardizing the spectra with maximum intensities thereof.

As shown in FIG. 2A, a spectrum A in this embodiment has light emission peaks near light wavelengths of 450 nm, 560 nm, and 630 nm. The peak near 450 nm corresponds to the light emission peak of the semiconductor light source. The peak near 560 nm and the peak near 630 nm respectively correspond to the light emission peaks of the yellow phosphor and the red phosphor.

For example, in the spectrum A, a ratio ($E_{RL}/E_{RS}$) of radiation energy $E_{RL}$ in a range of wavelength equal to or larger than 650 nm and equal to or smaller than 780 nm to an integrated value (radiation energy) $E_{RS}$ of light intensity in a range of wavelength equal to or larger than 600 nm and smaller than 650 nm is about 33%.

On the other hand, a spectrum B according to a comparative example shown in FIG. 2B has light emission peaks near light wavelengths of 450 nm and 630 nm. The spectrum B has a shoulder near 560 nm between 450 nm and 630 nm. The peak near 450 nm corresponds to the light emission peak of the semiconductor light source 5 and the peak near 630 nm corresponds to the light emission peak of the CASN phosphor. The shoulder near 560 nm corresponds to the light emission peak of the yellow phosphor.

The ratio ($E_{RL}/E_{RS}$) of the radiation energy $E_{RL}$ in the range of wavelength equal to or larger than 650 nm and equal to or smaller than 780 nm to the radiation energy $E_{RS}$ in the range of wavelength equal to or larger than 600 nm and smaller than 650 nm is about 114%.

As indicated by the standardized visibility $V(\lambda)$, in a red region of wavelength equal to or larger than 600 nm, visibility falls as wavelength is larger. For example, light in a wavelength range of 600 nm to 650 nm has larger contribution to color rendering properties than light in a wavelength range of 650 nm to 780 nm. Therefore, in this embodiment, the red phosphor having the light emission peak in the wavelength range of 600 nm to 650 nm, the half width of which is equal to or smaller than 20 nm, is used. Consequently, as explained above, it is possible to reduce spectrum components in the wavelength range of light wavelength equal to or larger than 650 nm and equal to or smaller than 780 nm and improve light emission efficiency.

For example, in both luminaires having the spectrum A and the spectrum B, Ra is 83 and there is no difference in color rendering properties. On the other hand, theoretical efficiency (light emission efficiency) of the spectrum A is 338 lumen/watt (lm/W) and theoretical efficiency (light emission efficiency) of the spectrum B is 294 lm/W. The theoretical efficiency is conversion efficiency from electricity obtained by weighting a radiation spectrum with the standardized visibility $V(\lambda)$ into light. That is, in this embodiment, it is possible to improve the light emission efficiency while maintaining the color rendering properties.

FIGS. 3A and 3B and FIGS. 4A and 4B show radiation spectra A according to this embodiment respectively obtained when correlated color temperature is set to 4000 K, 4500 K, 5000 K, and 6500 K. The abscissa indicates light wavelength and the ordinate indicates relative light emission intensity. For comparison, radiation spectra B according to a comparative example in which the CASN phosphor is used are also shown.

As shown in FIGS. 3A to 4B, as the correlated color temperature rises from 4000 K to 6500 K, light intensity of red light having wavelength equal to or larger than 600 nm relatively decreases. In the spectra A shown in FIGS. 3B to 4B, a shoulder near wavelength of 520 clearly appears as the correlated color temperature increases. The shoulder corresponds to the light emission peak of the green phosphor.

Table 1 shows values of theoretical efficiency (lm/W) and a special color rendering index R9 of the luminaires according to this embodiment and the comparative example with respect to the correlated color temperatures. The average color rendering index Ra is 83 at all the correlated color temperatures.

TABLE 1

| | THEORETICAL EFFICIENCY (lm/W) | | Ra | | R9 | |
|---|---|---|---|---|---|---|
| | A | B | A | B | A | B |
| 2800K | 338 | 294 | 83 | 83 | 74 | 61 |
| 4000K | 333 | 290 | 83 | 83 | 58 | 52 |
| 4500K | 329 | 291 | 83 | 83 | 55 | 49 |
| 5000K | 324 | 290 | 83 | 83 | 51 | 47 |
| 6500K | 310 | 287 | 83 | 83 | 48 | 41 |

The theoretical efficiency according to this embodiment is higher than the theoretical efficiency according to the comparative example at all the correlated color temperatures. Values of the theoretical efficiency is equal to or larger than 310 (lm/W). If the correlated color temperature is limited to be equal to or smaller than 5000 K, the theoretical efficiency is equal to or larger than 320 (lm/W). Further, R9 indicating color rendering properties of red is a value larger than R9 in the comparative example.

Table 2 shows two indexes indicating contribution of red light on a long wavelength side at the correlated color temperatures.

TABLE 2

| | $P_R$ | $E_{RS}/E_{RL}$ | |
|---|---|---|---|
| | A | A | B |
| 2800 K | 0.214 | 0.33 | 1.14 |
| 4000 K | 0.264 | 0.34 | 1.00 |
| 4500 K | 0.269 | 0.33 | 0.97 |
| 5000 K | 0.273 | 0.32 | 0.93 |
| 6500 K | 0.287 | — | — |

One index is a light emission intensity ratio $P_R$ at light wavelength 650 with respect to the intensity of a light emission peak in the wavelength range of light wavelength of 600 to 650 nm. As in the radiation spectra shown in FIGS. 2A to 3B, if there is no light emission peak at wavelength equal to or larger than 650 nm, the light emission intensity ratio $P_R$ of light emission intensity at wavelength of 650 nm and peak intensity of light emission in the wavelength range of the light wavelength of 600 to 650 nm represents contribution of red light on a long wavelength side with low visibility.

As it is evident from the spectra shown in FIGS. 2A to 3B, the light emission intensity ratio $P_R$ according to this embodiment is smaller than a ratio of light emission intensity at wavelength of 650 nm to the intensity of the light emission peak of the CASN phosphor according to the comparative example. As the correlated color temperature increases, a value of $P_R$ increases but does not exceed 0.29.

The other index shown in Table 2 is a ratio of the radiation energy $E_{RL}$ in the range of wavelength equal to or larger than 650 nm and equal to or smaller than 780 nm to the radiation energy $E_{RS}$ in the range of wavelength equal to or larger than 600 nm and smaller than 650 nm. $E_{RL}/E_{RS}$ represents contribution of the red light on the long wavelength side irrespective of presence or absence of a light emission peak in the range of wavelength equal to or larger than 650 nm and equal to or smaller than 780 nm.

As shown in Table 2, $E_{RL}/E_{RS}$ in this embodiment is smaller than $E_{RL}/E_{RS}$ in the comparative example and does not exceed 35% at the correlated color temperature of 2800 K to 5000 K.

As explained above, in this embodiment, the red phosphor having the light emission peak in the range of wavelength equal to or larger than 600 nm and smaller than 650 nm and $E_{RL}/E_{RS}$ equal to or smaller than 35% is used. Consequently, it is possible to realize a luminaire in which both of the light emission efficiency and the color rendering properties are improved.

Second Embodiment

FIGS. 5A and 5B and FIGS. 6A and 6B show radiation spectra of a luminaire according to a second embodiment. The luminaire according to this embodiment has a configuration same as the configuration of the luminaire 100 shown in FIGS. 1A and 1B. Phosphors included in the second transparent resin 9 of the luminaire according to this embodiment are different from those in the first embodiment. That is, the second transparent resin 9 includes a red phosphor and a yellow phosphor. The red phosphor has a light emission peak in a wavelength range of 600 nm to 650 nm. The half width of the light emission peak is equal to or smaller than 20 nm. The yellow phosphor has a light emission peak in 530 nm to 570 nm. The half width of the light emission peak is 60 nm to 120 nm.

Figure 5A:
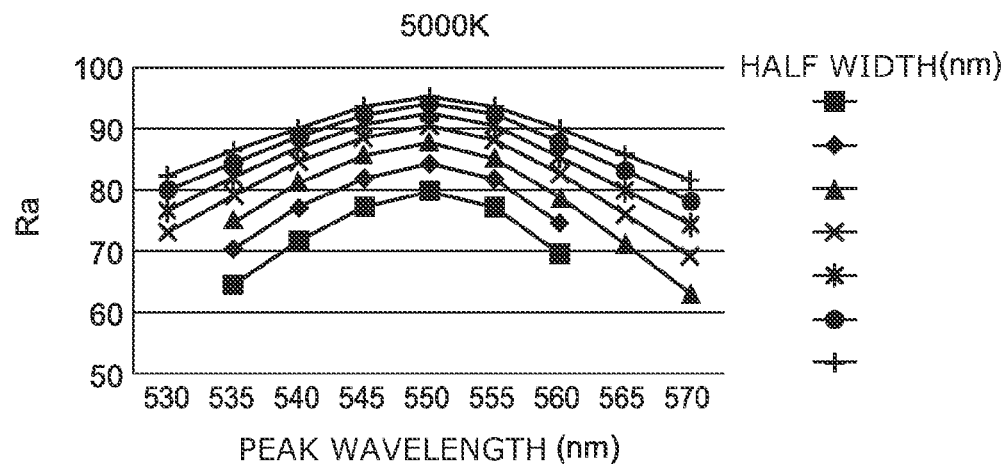
FIGS. 5A and 5B show radiation spectra of a luminaire according to a second embodiment.
Figure 5B:
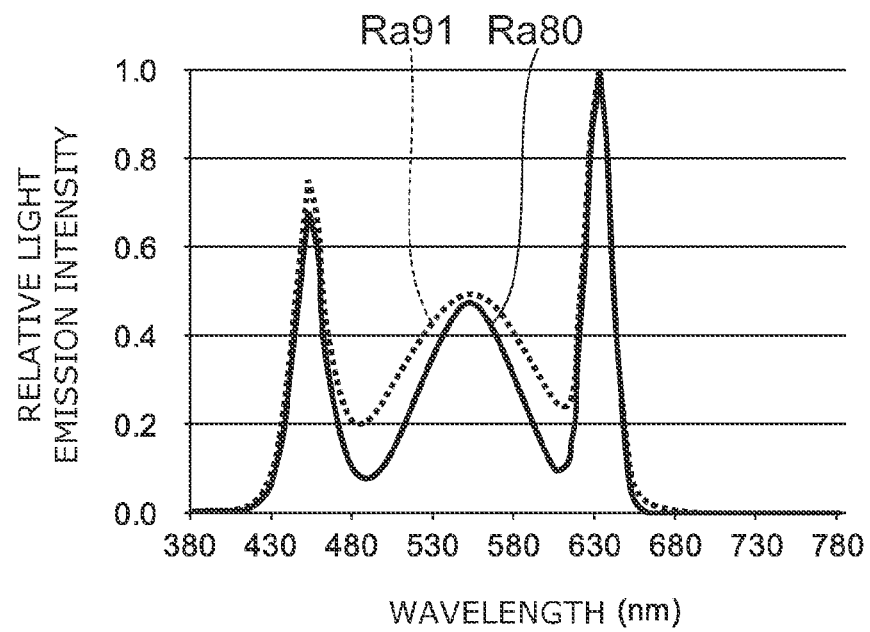

FIG. 5A is a graph representing, with the half width of the light emission peak of the yellow phosphor set as a parameter, a relation between the peak wavelength of the yellow phosphor and Ra in the case of correlated color temperature of 5000 K. FIG. 5B shows a radiation spectrum of the luminaire according to this embodiment.

According to FIG. 5A, Ra can be set larger as the half width of the light emission peak is larger. For example, it is possible to obtain Ra equal to or larger than 80 by using a yellow phosphor having a light emission peak in a wavelength range of 530 nm to 570 nm, half width of which is equal to or larger than 110 nm. If the wavelength at the light emission peak is 550 nm, Ra can be set to 80 even if the half width of the light emission peak is 60 nm.

For example, a luminaire having a radiation spectrum indicated by a solid line in FIG. 5B includes the semiconductor light sources 5, the wavelength at a light emission peak of which is 450 nm. The second transparent resin 9 includes a red phosphor, the wavelength at a light emission peak of which is 630 nm and the half width of the light emission peak is 16 nm, and a yellow phosphor, the wavelength at a light emission peak of which is 550 nm and the half width of the light emission peak is 60 nm. As a result, a luminaire having Ra of 80 and theoretical efficiency of 331 lm/W can be obtained.

Further, according to FIG. 5A, if a phosphor having a light emission peak in a wavelength range of 540 nm to 560 nm, half width of which is equal to or larger than 110 nm, is used, it is possible to obtain a luminaire having Ra equal to or larger than 90. If the wavelength at the light emission peak is 550 nm, Ra can be set to 90 even if the half width is 90 nm.

For example, a luminaire having a radiation spectrum indicated by a broken line in FIG. 5B includes the semiconductor light sources 5, the wavelength at a light emission peak of which is 450 nm. The second transparent resin 9 includes a red phosphor, the wavelength at a light emission peak of which is 630 nm and the half width of the light emission peak is 16 nm, and a phosphor, the wavelength at a light emission peak of which is 550 nm and the half width of the light emission peak is 90 nm. As a result, a luminaire having Ra of 91 and theoretical efficiency of 325 lm/W can be obtained.

Figure 6A:
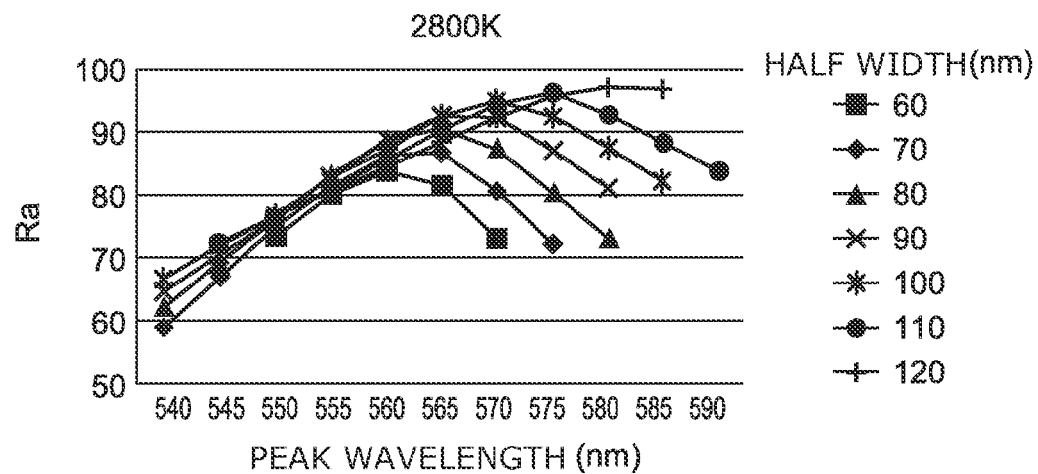
FIGS. 6A and 6B show radiation spectra of the luminaire according to the second embodiment.
Figure 6B:
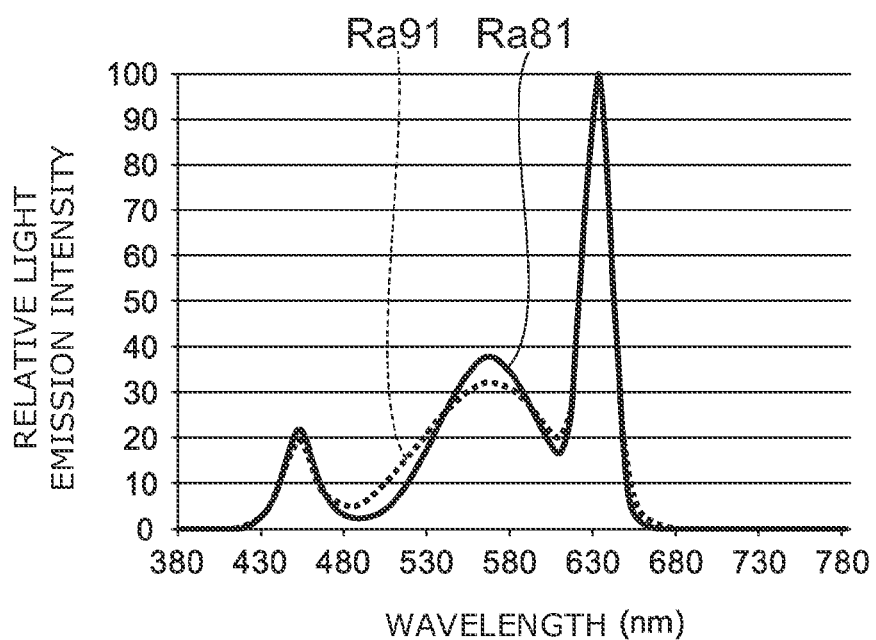

FIG. 6A is a graph representing, with the half width of the light emission peak of the yellow phosphor set as a parameter, a relation between the peak wavelength of the yellow phosphor and Ra in the case of correlated color temperature of 2800 K. FIG. 6B shows a radiation spectrum of the luminaire according to this embodiment.

According to FIG. 6A, for example, it is possible to obtain Ra equal to or larger than 80 by using a yellow phosphor having a light emission peak in a wavelength range of 555 nm to 580 nm, half width of which is equal to or larger than 90 nm. If the wavelength at the light emission peak is 555 m to 565 nm, Ra can be set to 80 even if the half width of the light emission peak is 60 nm.

For example, a luminaire having a radiation spectrum indicated by a solid line in FIG. 6B includes the semiconductor light sources 5, the wavelength at a light emission peak of which is 450 nm. The second transparent resin 9 includes a red phosphor, the wavelength at a light emission peak of which is 630 nm and the half width of the light emission peak is 16 nm, and a yellow phosphor, the wavelength at a light emission peak of which is 565 nm and the half width of the light emission peak is 60 nm. As a result, a luminaire having Ra of 81 and theoretical efficiency of 368 lm/W can be obtained.

Further, according to FIG. 6A, if a phosphor having a light emission peak at light wavelength of 565 nm, half width of which is equal to or larger than 80 nm, is used, it is possible to obtain a luminaire having Ra equal to or larger than 90. As the half width of the light emission peak increases from 80 nm, a wavelength range at the light emission peak in which Ra equal to or larger than 90 can be obtained expands.

For example, a luminaire having a radiation spectrum indicated by a solid line in FIG. 6B includes the semiconductor light sources 5, the wavelength at a light emission peak of which is 450 nm. The second transparent resin 9 includes a red phosphor, the wavelength at a light emission peak of which is 630 nm and the half width of the light emission peak is 16 nm, and a phosphor, the wavelength at a light emission peak of which is 565 nm and the half width of the light emission peak is 80 nm. As a result, a luminaire having Ra of 91 and theoretical efficiency of 354 lm/W can be obtained.

As explained above, in this embodiment, the second transparent resin 9 includes the red phosphor having the light emission peak in the wavelength range of 600 nm to 650 nm, the half width of which is equal to or smaller than 20 nm, and the yellow phosphor having the light emission peak in 530 nm to 570 nm, the half width of which is 60 nm to 120 nm. It is possible to improve Ra and light emission efficiency by controlling the wavelength at the light emission peak and the half width of the light emission peak of the yellow phosphor.

Further, in the radiation spectrum shown in FIGS. 5B and 6B, a red spectrum in a region of wavelength equal to or larger than 650 nm and equal to or smaller than 780 nm is suppressed. $E_{RL}/E_{RS}$ is equal to or smaller than 10%. For example, $E_{RL}/E_{RS}$ in the radiation spectrum shown in FIG. 6B is 8.2 to 8.4%. As a result, light emission efficiency larger than the example in the first embodiment shown in Table 1 can be obtained.

As explained above, in this embodiment, the second transparent resin 9 includes the red phosphor having the light emission peak in the wavelength range of 600 nm to 650 nm, the half width of which is equal to or smaller than 20 nm, and the yellow phosphor. Consequently, it is possible to set $E_{RL}/E_{RS}$ to, for example, 10% or less and improve Ra and the light emission efficiency.

Third Embodiment

Figure 7A:
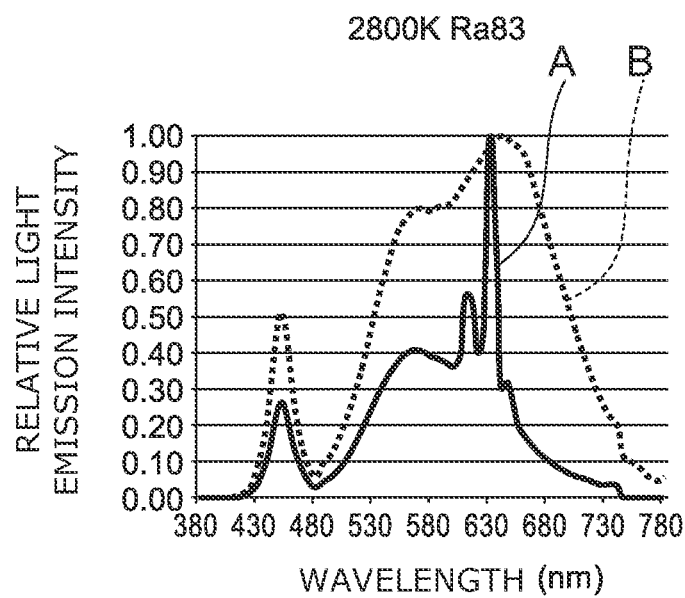
FIGS. 7A and 7B are graphs representing a light emission characteristic of a luminaire according to a third embodiment.
Figure 7B:
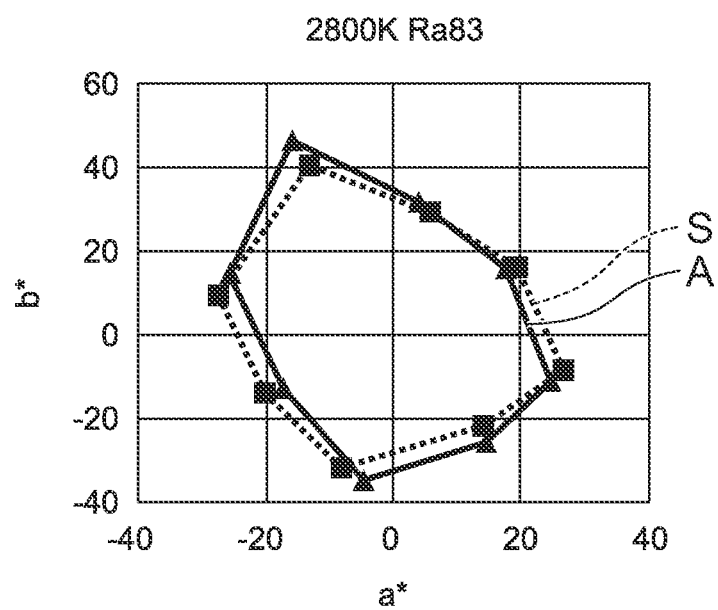

FIGS. 7A and 7B are graphs representing a light emission characteristic at correlated color temperature of 2800 K and Ra of 83 of a luminaire according to a third embodiment. FIG. 7A shows a radiation spectrum A of the luminaire according to this embodiment and the radiation spectrum B of the luminaire according to the comparative example. FIG. 7B shows color coordinates of JIS color rendering evaluation test colors No. 1 to 8 at the correlated color temperature of 2800 and Ra of 83. The abscissa is an a* axis and the ordinate is a b* axis.

In this embodiment, the second transparent resin 9 includes, for example, $K_2SiF_6$:Mn as a red phosphor. Light emission peaks of $K_2SiF_6$:Mn are present near light wavelengths of 615 nm, 635 nm, and 648 nm. Half width of each of the light emission peaks is equal to or smaller than 20 nm. The second transparent resin 9 includes a yellow phosphor having a light emission peak in a range of wavelength equal to or larger than 540 nm and equal to or smaller than 580 nm and a green phosphor having a light emission peak in a range of wavelength equal to or larger than 480 nm and smaller than 540 nm.

In the radiation spectrum A shown in FIG. 7A, $E_{RL}/E_{RS}$ is 33% and theoretical efficiency is 339 lm/W. On the other hand, in the radiation spectrum B according to the comparative example in which the CASN phosphor is used as the red phosphor, $E_{RL}/E_{RS}$ is 114% and the theoretical efficiency is 269 lm/W.

As shown in FIG. 7B, a color gamut area A formed by connecting the color coordinates of the test colors No. 1 to 8 is larger than a color gamut area S of reference light. A color gamut area ratio is 102%. Here, the color gamut area ratio is defined as a ratio of the area surrounded by No. 1-8 of CIE test colors illuminated by the test illuminant to the area illuminated by the reference illuminant. The correlated color temperature of the luminaire according to this embodiment is 2800 K. Black body radiation at 2800 K can be used as the reference illuminant.

Figure 8A:
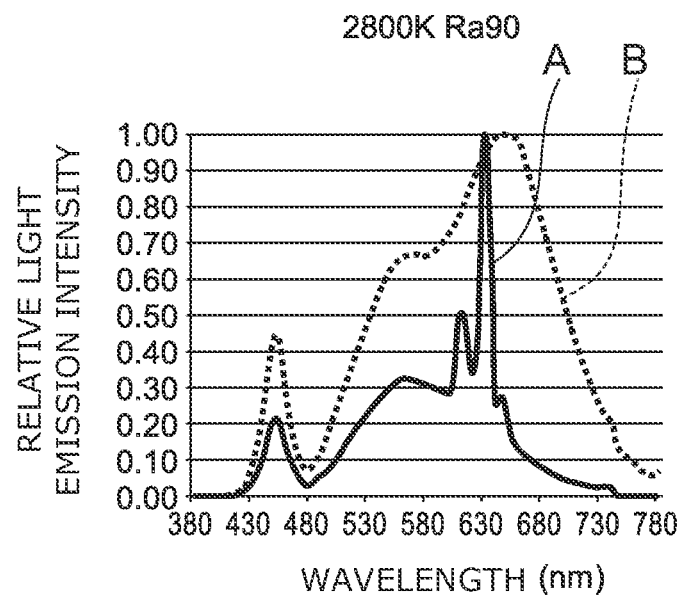
FIGS. 8A and 8B are graphs representing another light emission characteristic of the luminaire according to the third embodiment.
Figure 8B:
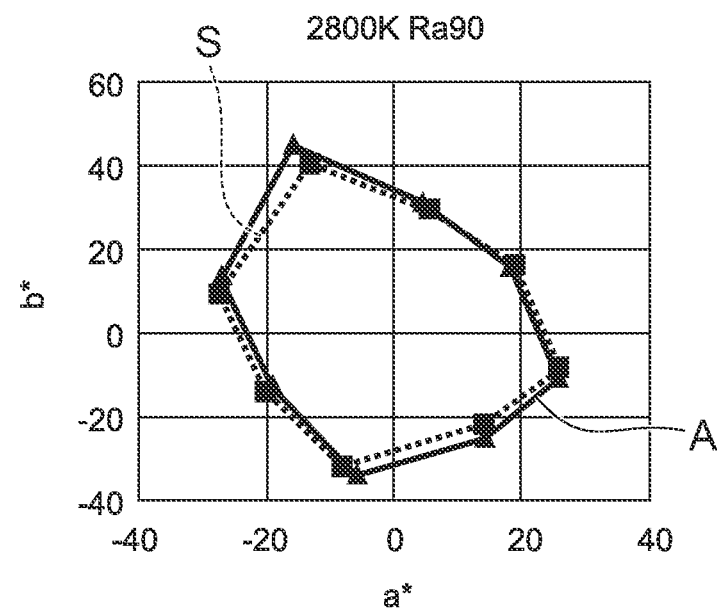

FIGS. 8A and 8B are graphs representing a light emission characteristic at correlated color temperature of 2800 K and Ra of 90 of the luminaire according to the third embodiment.

In the radiation spectrum A shown in FIG. 8A, $E_{RL}/E_{RS}$ is 27% and theoretical efficiency is 335 lm/W. On the other hand, in the radiation spectrum B according to the comparative example, $E_{RL}/E_{RS}$ is 124% and the theoretical efficiency is 252 lm/W. The color gamut area A shown in FIG. 8A is larger than the color gamut area S of the reference light. A color gamut area ratio is 106%.

As explained above, in this embodiment, it is possible to reduce $E_{RL}/E_{RS}$ and improve the light emission efficiency by using $K_2SiF_6$:Mn as the red phosphor.

Further, for example, according to JIS 28726 (reference: an evaluation method for color rendering properties other than a method by a color rendering index), if a ratio (a color gamut area ratio) of a color gamut area representing color rendering properties of irradiated body irradiated by a sample light source exceeds 100% with respect to a color gamut area formed by connecting eight points on a chromaticity coordinate representing color rendering properties of the irradiated body irradiated by the reference light, it can be expected that the sample light source clearly shows a color of an object on which light is irradiated. Therefore, as a result of evaluating a color gamut area ratio of the luminaire according to this embodiment using the above-described standard, the color gamut area ratio is 102% at Ra of 83 and is 106% at Ra of 90. That is, in this embodiment, it is possible to clearly show a color of the irradiated body and the color rendering properties are improved.

The color gamut area ratio equal to or lower than 100% is unsuitable because it is likely that a color tint of the irradiated body is lost and the irradiated body is misrecognized. If the color gamut area ratio is equal to or higher than 130%, an original color tint sometimes cannot be recognized, for example, a tinge of red excessively increases. A harmful influence of an excessively clear color occurs. Therefore, a suitable range of the color gamut area ratio is equal to or higher than 100% and equal to or lower than 130%.

As explained above, in this embodiment, it is possible to improve the light emission efficiency and the color rendering properties by using a blue LED, the red phosphor having the light emission peak in the range of wavelength equal to or higher than 610 nm and smaller than 650 nm, the half width of which is equal to or smaller than 20 nm, and at least the yellow phosphor. Consequently, it is possible to prevent the appearance of the irradiated body from being spoiled in practical use and realize a luminaire extremely useful for improving the quality of light (illumination).

A semiconductor light source that irradiates light having wavelength shorter than the wavelength of the blue LED, for example, an ultraviolet LED may be used. In that case, a blue phosphor excited by radiated light of the ultraviolet LED and having a light emission peak at, for example, wavelength equal to or larger than 450 nm and equal to or smaller than 480 nm may be added.

Figure 9:
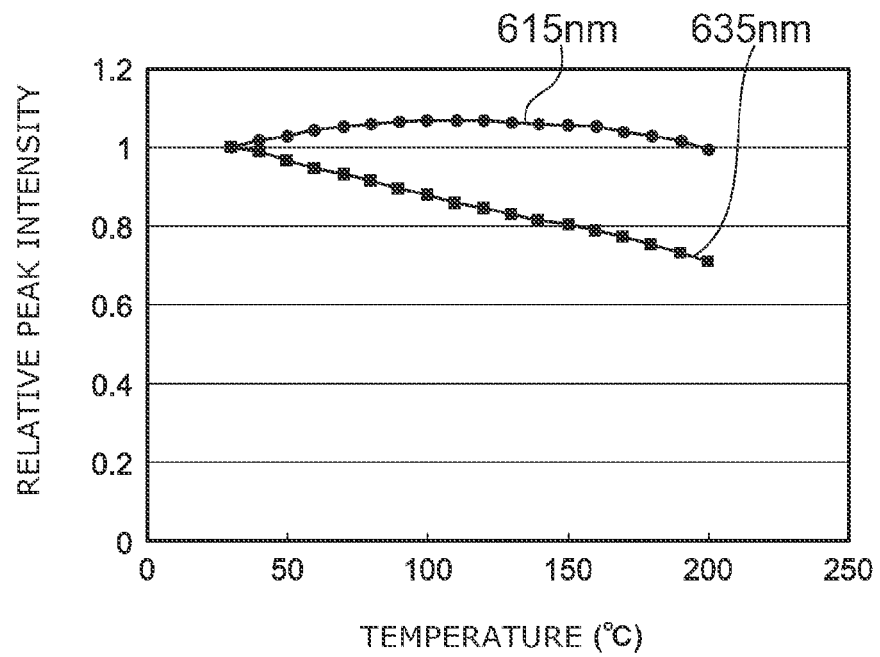
FIG. 9 is a graph representing a temperature characteristic at a light emission peak of a phosphor according to the third embodiment.

FIG. 9 is a graph representing a temperature characteristic at the light emission peak of the red phosphor according to this embodiment. The abscissa indicates the temperature of the phosphor and the ordinate indicates relative peak intensity standardized with the intensity of the light emission peak at 25° C.

As shown in the figure, the intensity at the light emission peak of light wavelength of 635 nm falls to about 70% as temperature rises in a temperature range of 25° C. to 200° C. On the other hand, the intensity at the light emission peak of light wavelength 615 nm does not fall even if temperature rises and is higher than the peak intensity at 25° C. in the temperature range of 25° C. to 200° C.

As explained above, in the red phosphor according to this embodiment, temperature fluctuation of the light emission peak on a short wavelength side with high visibility is smaller than temperature fluctuation of the light emission peak on a long wavelength side. Consequently, it is possible to realize a luminaire in which a change in the correlated color temperature and a change in Ra due to temperature are suppressed.

Figure 10:
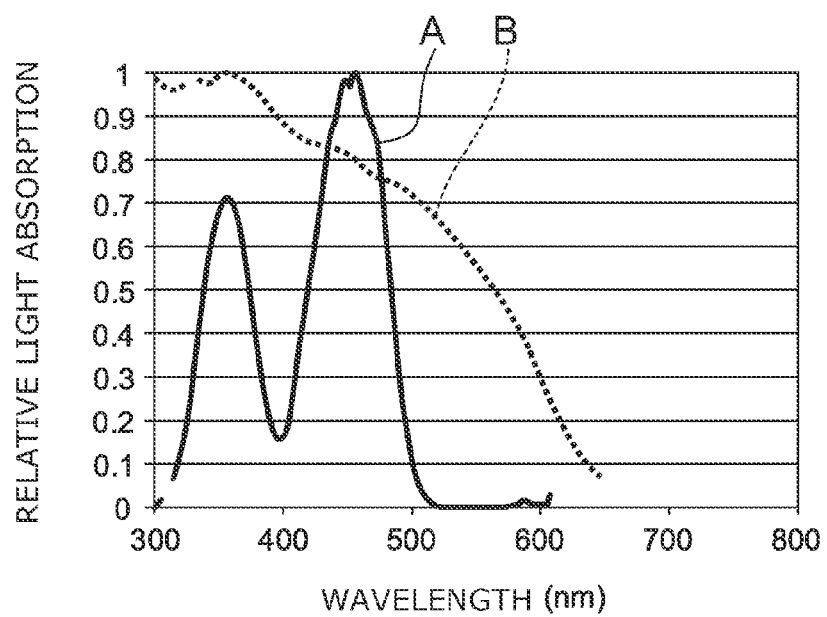
FIG. 10 is a graph representing an excitation characteristic of the phosphor according to the third embodiment.

FIG. 10 is a graph representing an excitation characteristic of the red phosphor according to this embodiment. For comparison, an excitation characteristic of the CASN phosphor is also shown. The abscissa indicates light wavelength and the ordinate indicates a relative light absorption ratio standardized with a peak value.

As shown in FIG. 10, the red phosphor $K_2SiF_6$:Mn according to this embodiment has absorption peaks near light wavelengths of 350 nm and 450 nm. Therefore, the red phosphor $K_2SiF_6$:Mn can be excited by the semiconductor light sources 5 having a light emission peak in a range of light wavelength smaller than 480 nm.

On the other hand, an excitation spectrum B of the CASN phosphor according to the comparative example extends to light wavelength near a light emission peak thereof. That is, the CASN phosphor absorbs light in wavelength ranges of green and yellow and emits red light. That is, the CASN phosphor absorbs not only the blue light of the semiconductor light sources 5 but also lights radiated by the green phosphor and the yellow phosphor. Therefore, if the CASN phosphor and the green and yellow phosphors are used in mixture, the light emission efficiency falls.

On the other hand, an excitation spectrum A of the red phosphor $K_2SiF_6$:Mn has light wavelength equal to or smaller than 520 nm. Absorption of radiated light of the green phosphor is reduced and radiated light of the yellow phosphor is not absorbed. Therefore, if the red phosphor $K_2SiF_6$:Mn and the green and yellow phosphors are used in mixture, it is possible to suppress the light emission efficiency from falling.

If the CASN phosphor and the yellow phosphor are used in mixture, in order compensate for yellow light reduced by the absorption of the CASN phosphor, it is necessary to increase an amount of the yellow phosphor. On the other hand, if the red phosphor $K_2SiF_6$:Mn and the yellow phosphor are used in mixture, since the yellow light is not absorbed, a predetermined amount of the yellow phosphor only has to be mixed. That is, it is possible to reduce an amount of the yellow phosphor.

For example, if the red phosphor $K_2SiF_6$:Mn and the YAG phosphor are mixed to obtain a radiation spectrum of 2800 K, a weight ratio of the red phosphor to the yellow phosphor is at least 300%. Since volume density of a phosphor decreases when an average particle diameter of the phosphor increases, the weight ratio of the red phosphor to the yellow phosphor increases to 300% or higher. Specifically, if the average particle diameter of the phosphor is 20 to 30 micrometers, an amount of the red phosphor $K_2SiF_6$:Mn is six to seven times as large as an amount of the YAG phosphor. That is, in this embodiment, if the correlated color temperature of a radiation spectrum is set to 3000 K or less, the weight of the red phosphor is three times or more as large as the weight of the yellow phosphor.

As explained above, according to the first to third embodiments, it is possible to set the ratio $E_{RL}/E_{RS}$ of the radiation energy in the range of wavelength equal to or larger than 650 nm and equal to or smaller than 780 nm to the radiation energy in the range of wavelength equal to or larger than 600 nm and smaller than 650 nm to 35% or less by using the red phosphor having the light emission peak in the range of wavelength equal to or larger than 610 nm and smaller than 650 nm, the half width of which is equal to or smaller than 20 nm. Consequently, it is possible to realize a luminaire in which the light emission efficiency is improved while the color rendering properties are maintained. A luminaire that clearly shows a color of an irradiated object is realized by setting the color gamut area ratio in the JIS standard to 100% or more.

Further, it is possible to suppress fluctuation in the correlated color temperature and fluctuation in Ra due to temperature by using the red phosphor $K_2SiF_6$:Mn in which the temperature fluctuation at the light emission peak on the short wavelength side with high visibility is small. It is possible to reduce an amount of the yellow phosphor dispersed in transparent resin.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention.

What is claimed is:

1. A luminaire comprising:
   a semiconductor light source having a light emission peak in a range of wavelength smaller than 480 nm; and
   a phosphor excited by light radiated from the semiconductor light source to radiate light having wavelength equal to or larger than 480 nm, wherein
   a spectrum of radiated light obtained by combining the light radiated from the semiconductor light source and the light radiated from the phosphor has a light emission peak in a range of wavelength equal to or larger than 610 nm and smaller than 650 nm,
   a ratio of radiation energy in a range of wavelength equal to or larger than 650 nm and equal to or smaller than 780 nm to radiation energy in a range of wavelength equal to or larger than 600 nm and smaller than 650 nm is equal to or lower than 35%, and
   a color gamut area ratio exceeds 100%.

2. The luminaire according to claim 1, wherein the phosphor includes a first phosphor having a light emission peak in a range of wavelength equal to or larger than 610 nm and smaller than 650 nm, a second phosphor having a light emission peak in a range of wavelength equal to or larger than 540 nm and equal to or smaller than 580 nm, and a third phosphor having a light emission peak in a range of wavelength equal to or larger than 480 nm and smaller than 540 nm.

3. The luminaire according to claim 1, wherein the phosphor includes a first phosphor having a light emission peak in a range of wavelength equal to or larger than 610 nm and smaller than 650 nm and a second phosphor having a light emission peak in a range of wavelength equal to or larger than 540 nm and equal to or smaller than 580 nm.

4. The luminaire according to claim 3, wherein the ratio of the radiation energy in the range of wavelength equal to or larger than 650 nm and equal to or smaller than 780 nm to the radiation energy in the range of wavelength equal to or larger than 600 nm and smaller than 650 nm is equal to or lower than 10%.

5. The luminaire according to claim 3, wherein a ratio of light emission intensity at light wavelength of 650 nm to intensity at the light emission peak in the range of wavelength equal to or larger than 610 nm and smaller than 650 nm is smaller than 0.29.

6. The luminaire according to claim 2, wherein
   correlated color temperature of the radiated light obtained by combining the light radiated from the semiconductor light source and the light radiated from the phosphor is equal to or lower than 3000 kelvin, and
   weight of the first phosphor is three times or more as large as weight of the second phosphor.

7. The luminaire according to claim 1, wherein
   the phosphor has at least a pair of the light emission peaks in the range of wavelength equal to or larger than 610 nm and smaller than 650 nm, and
   fluctuation in the light emission peak on a short wavelength side due to temperature is smaller than fluctuation in the light emission peak on a long wavelength side due to temperature.

8. The luminaire according to claim 1, further comprising:
   a substrate mounted with the semiconductor light source; and
   transparent resin provided on the substrate and including the phosphor.

9. The luminaire according to claim 8, wherein the transparent resin includes:
   first transparent resin formed to seal the semiconductor light source on the substrate and containing a member that scatters radiated light of the semiconductor light source; and
   second transparent resin provided on the first transparent resin and containing the phosphor.

10. The luminaire according to claim 8, wherein the transparent resin includes:
    first transparent resin formed to seal the semiconductor light source and containing a phosphor having a light emission peak in a range of wavelength equal to or larger than 540 nm and equal to or smaller than 580 nm; and
    second transparent resin provided on the first transparent resin and containing a phosphor having a light emission peak in a range of wavelength equal to or larger than 610 nm and smaller than 650 nm.

11. The luminaire according to claim 10, wherein the first transparent resin includes a main component same as a main component of the second transparent resin.

12. The luminaire according to claim 8, wherein the transparent resin includes:
    resin containing a first phosphor having a light emission peak in a range of wavelength equal to or larger than wavelength 610 nm and smaller than 650 nm;
    resin containing a second phosphor having a light emission peak in a range of wavelength equal to or larger than 540 nm and equal to or smaller than 580 nm; and
    resin containing a third phosphor having a light emission peak in a range of wavelength equal to or larger than 480 nm and smaller than 540 nm.

13. The luminaire according to claim 12, wherein the first phosphor, the second phosphor, and the third phosphor are arranged from the substrate side in order from the phosphor having a smallest change in light emission intensity due to temperature.

14. The luminaire according to claim 1, wherein the phosphor contains a fluoride phosphor having a light emission peak in a range of wavelength equal to or larger than 610 nm and smaller than 650 nm.

* * * * *